US008525562B1

(12) United States Patent
Jones

(10) Patent No.: US 8,525,562 B1
(45) Date of Patent: Sep. 3, 2013

(54) SYSTEMS AND METHODS FOR PROVIDING A CLOCK SIGNAL USING ANALOG RECURSION

(75) Inventor: John David Jones, Pittsburgh, PA (US)

(73) Assignee: DS Zodiac, Inc., Seattle, WA (US)

( * ) Notice: Subject to any disclaimer, the term of this patent is extended or adjusted under 35 U.S.C. 154(b) by 0 days.

(21) Appl. No.: 13/597,034

(22) Filed: Aug. 28, 2012

(51) Int. Cl.
*H03L 7/00* (2006.01)

(52) U.S. Cl.
USPC ....................... 327/141; 327/296; 375/240.28

(58) Field of Classification Search
None
See application file for complete search history.

(56) References Cited

U.S. PATENT DOCUMENTS

| | | | | |
|---|---|---|---|---|
| 7,191,402 | B2 * | 3/2007 | Kim et al. | 715/723 |
| 2008/0304573 | A1 * | 12/2008 | Moss et al. | 375/240.28 |
| 2009/0273716 | A1 * | 11/2009 | Wu | 348/607 |
| 2010/0002773 | A1 * | 1/2010 | Huggett et al. | 375/240.16 |
| 2012/0300960 | A1 * | 11/2012 | Mackay et al. | 381/119 |

* cited by examiner

*Primary Examiner* — Thomas J Hiltunen
(74) *Attorney, Agent, or Firm* — Betts, Patterson & Mines, P.S.

(57) ABSTRACT

Systems and methods for generating clock signals using analog recursion are provided. In some embodiments, an analog recursion system includes an analog recursion device and one or more recursion loops. The recursion loops interact to form periodic phenomena within the analog recursion device, which may be sampled to generate clock state. By tuning settings of the analog recursion device, the clock state generated by the analog recursion system may be tailored for a variety of purposes.

15 Claims, 5 Drawing Sheets

5/5

SYSTEMS AND METHODS FOR PROVIDING A CLOCK SIGNAL USING ANALOG RECURSION

BACKGROUND

In the past, clock signals have been generated using a variety of techniques. One common technique is to use the mechanical resonance of a vibrating crystal of piezoelectric material to create a periodic electrical signal. While common, this technique has drawbacks, including the fact that, once created, such a mechanism cannot be further tuned. What is needed is a system that can generate a stable, tunable clock signal usable for a wide range of purposes.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, a system for generating a clock signal is provided. The system comprises a mixing device, a set of output devices, and a set of input devices. The mixing device includes a set of input channels, a mixing circuit configured to combine a set of input signals from the set of input channels into a mixed input signal, a set of output channels configured to generate output signals based on the input signals, and a clock output channel configured to output a signal usable as a clock signal. The set of output devices is coupled to the set of output channels and is configured to generate output based on the output signals. The set of input devices is coupled to the set of input channels and is configured to generate input signals based on the output generated by the set of output devices.

In some embodiments, a method of producing a clock signal is provided. A recursion device receives a set of input signals from a set of input sensor devices. A set of output signals is produced based on the set of input signals. The set of output signals are provided to a set of output devices to affect the set of input signals. A clock signal is generated by sampling a state of the recursion device.

In some embodiments, an analog recursion device is provided. The analog recursion device includes a mixing circuit and a set of recursion loops coupled to the mixing circuit. The analog recursion device is configured to receive a set of signals via the set of recursion loops, process the set of signals using the mixing circuit, provide the processed set of signals to the set of recursion loops, and provide a state to be sampled to generate a clock signal.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
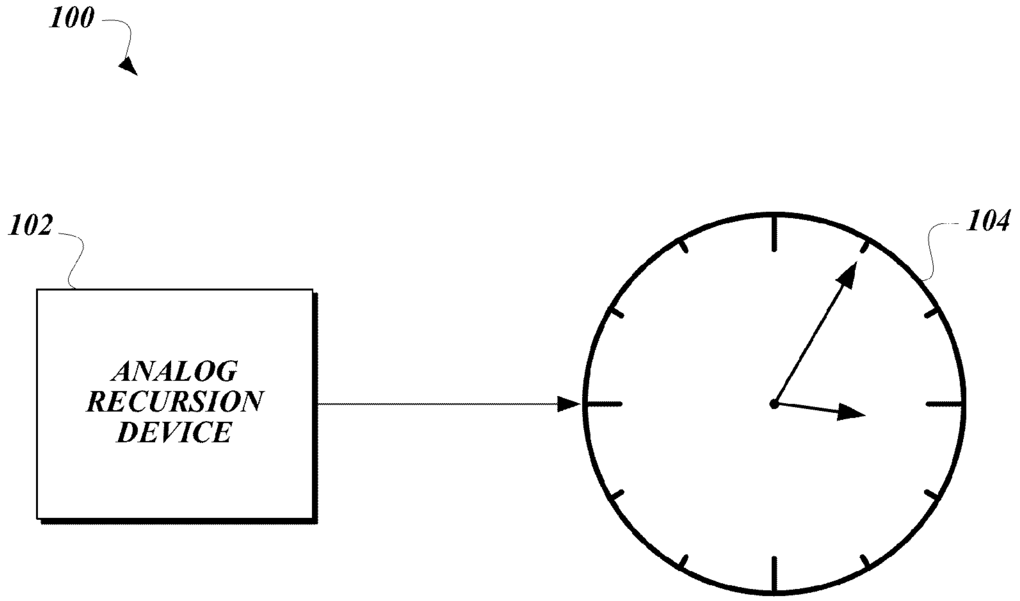
FIG. 1 is a schematic drawing illustrating an exemplary system configured according to various aspects of the present disclosure.

FIG. 1 is a schematic drawing illustrating an exemplary system 100 configured according to various aspects of the present disclosure. An analog recursion device 102 is coupled to and drives a clock display 104. The analog recursion device 102 exhibits periodically recurring behavior that is remarkably stable and tunable, which may be converted into a clock signal. The clock signal is provided to a mechanism that moves hands on the clock display 104 to display the passage of time. One of ordinary skill in the art will recognize that periodic signals generated by the analog recursion device 102 may be used in a fashion similar to a periodic signal generated by a crystal oscillator to drive a stepping motor or the like to move the hands on the clock display 104. One of ordinary skill in the art will recognize that such a periodic signal could be used for other purposes as well, including, but not limited to, clocking a computer processor, synchronizing a communication transmission, and/or the like. While embodiments are primarily discussed herein that harness the behaviors of analog recursion devices to generate clock signals, it will be readily apparent that behaviors of analog recursion devices could be used for purposes other than generating clock signals.

Figure 2:
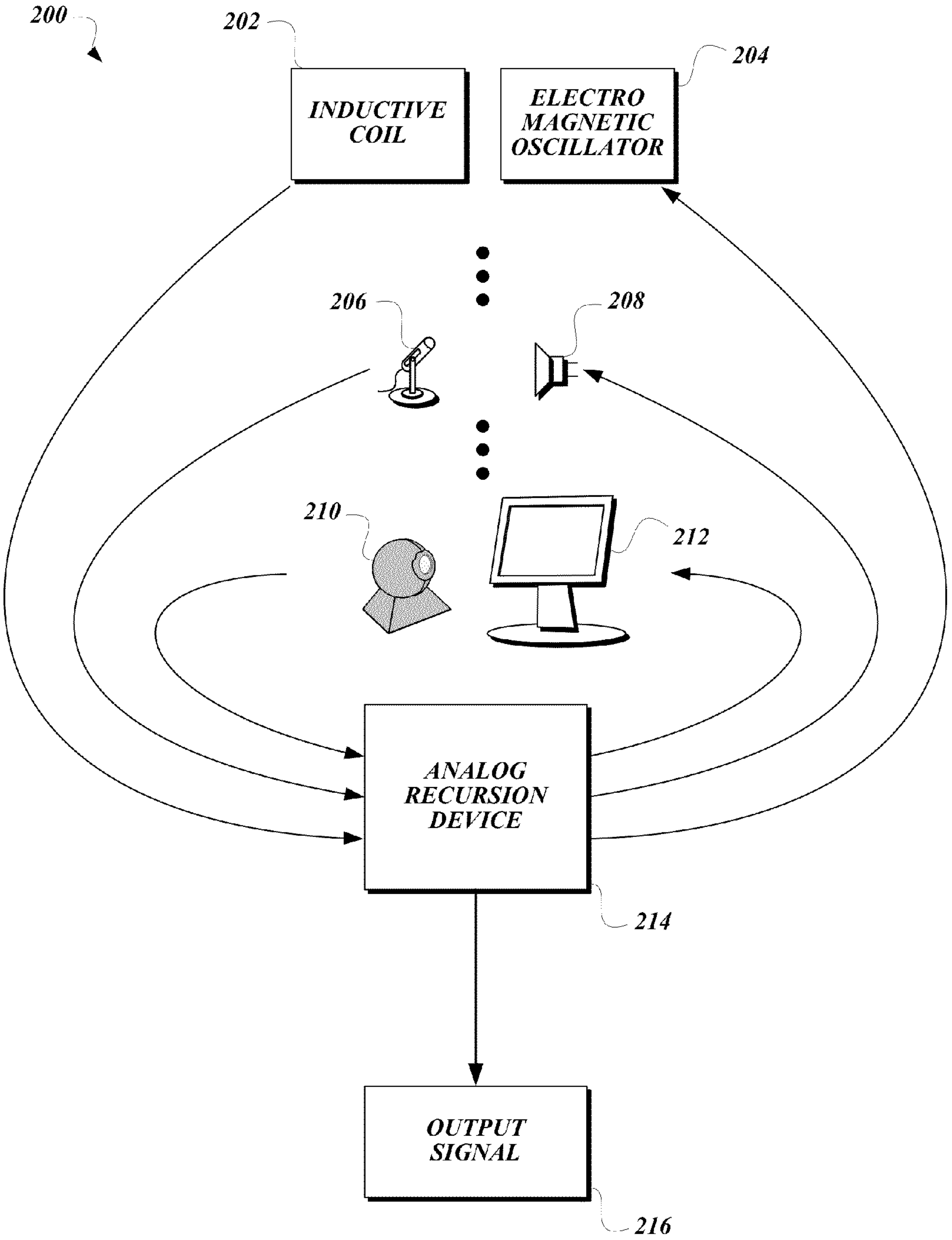
FIG. 2 is a schematic drawing illustrating an exemplary configuration of an analog recursion system according to various aspects of the present disclosure.

FIG. 2 is a schematic drawing illustrating an exemplary configuration of an analog recursion system 200 according to various aspects of the present disclosure. An analog recursion device 214 is configured to combine one or more analog recursion loops. As illustrated, the analog recursion device 214 is coupled to three recursion loops, but in other embodiments, more or fewer recursion loops may be present. In a first recursion loop, an output of the analog recursion device 214 is provided to an electromagnetic oscillator 204 and causes the electromagnetic oscillator 204 to resonate. Oscillations within the electromagnetic oscillator 204 are detected by an inductive coil 202 and are converted to an analog signal provided to an input of the analog recursion device 214. In a second recursion loop, an output of the analog recursion device 214 is provided to a loudspeaker 208. Sound produced by the loudspeaker 208 is detected by a microphone 206, which converts the sound to an analog signal provided to an input of the analog recursion device 214. In a third recursion loop, an output of the analog recursion device 214 is provided to a display device 212. The display device 212 generates a display based on the signal received from the analog recursion device 214. A camera 210 captures the display, and generates an analog signal based on the captured information. The analog signal from the camera 210 is provided to an input of the analog recursion device 214.

The various input signals are processed by the analog recursion device 214, which generates the corresponding output signals. The analog recursion device 214 unifies and harmonizes the input signals (in various distinct formats) and output signals (in various distinct formats) via their recursion through the analog recursion device 214, thus producing a machine state within the analog recursion device 214. The input and output signals, or other phenomena generated within the analog recursion device 214 according to the machine state, may be sampled to generate an output signal 216. This output signal 216 exhibits properties that are usable as a clock signal. In some embodiments, an input signal or an output signal may be sampled to generate the output signal 216. In some embodiments, the output signal 216 may be generated by sampling an indicator of machine state within the analog recursion device 214, such as an LED that indicates that a predetermined threshold has been crossed and/or the like. In some embodiments, more than one input signal, output signal, or indicator of machine state may be sampled to produce the output signal 216.

Some examples of suitable inductive coils 202, electromagnetic oscillators 204, microphones 206, cameras 210, and display devices 212 are discussed further below, but should be understood as exemplary only. In other embodiments, more, fewer, or different devices could be used within recursion loops connected to the analog recursion device 214.

In some embodiments, more than one output may be provided to a given output device. For example, a display device 212 may receive an audio signal and a separate video signal from the analog recursion device 214, even if it only the video signal is monitored by the camera 210. In some embodiments, more than one input may be combined in a single loop. For example, an output from the microphone 206 and an output from the camera 210 may be combined before being provided as a single input to the analog recursion device 214. In some embodiments, no input or output devices may be included in a recursion loop. That is, an output of the analog recursion device 214 may be coupled directly to an input of the analog recursion device 214 to establish a recursion loop.

In some embodiments, the first recursion loop, the second recursion loop, and the third recursion loop may be isolated from each other. In other words, the microphone 206 may be situated to only sense sound emitted by the loudspeaker 208, the camera 210 may be situated to only monitor patterns presented by the display device 212, and/or the like. In some embodiments, the recursion loops may be configured to influence each other. For example, the microphone 206 may be situated to sense sound emitted by the loudspeaker 208 as well as by the display device 212, the electromagnetic oscillator 204, and/or the like. The recursion loops may also be isolated from each other or may influence each other within the analog recursion device 214.

In some embodiments, at least one output device and at least one corresponding input sensor device may be incorporated within the analog recursion device 214. Various components of the analog recursion system 200 may be miniaturized and, though functionally similar to the separate devices illustrated in FIG. 2, the analog recursion system 200 may be embodied in a single device. In such an embodiment, custom miniaturized components that output or sense similar oscillating phenomena to those illustrated and discussed above may be used within the single device to establish the recursion loops.

The output signal 216 may take various forms. In some embodiments, the output signal 216 may be generated by monitoring a peak amplitude of a sum of signals propagating through one or more of the recursion loops. A clock pulse may be generated for the output signal 216 upon detecting that the peak amplitude has crossed a threshold. In such an embodiment, the output signal 216 may be a square wave clock signal, wherein a high state of the output signal 216 indicates that the peak amplitude is above the threshold. Upon tuning the recursion loops to a predetermined frequency, such a clock signal will represent a stable, periodic signal. In some embodiments, the output signal 216 may be a sine wave signal, which may either be used directly as a clock signal, or may be converted to a square wave clock signal by an external device.

The use of an analog recursion system as described herein for generating stable periodic signals has numerous advantages compared to other solutions. In the disclosed analog recursion system, the stable harmonic pathways are directly analogous to geostationary orbits in orbital mechanics, and therefore serve as a reference. Accordingly, one benefit is that no external reference is necessary, as the recursion loops, in a convergent search for thermodynamic efficiency, provide a self-referential oscillator mechanism. While different components and configurations may exhibit superficially different oscillatory phenomena, it is also true that the analog recursion mechanisms described herein are perhaps a unique means by which the fundamentally and universally organic harmonic pathways can be isolated and identified. In other words, a clock constructed on the principle of analog recursion as disclosed herein not only does not require an external reference, but may also be the means for constructing a clock capable of serving as such a reference for all other clocks.

Figure 3:
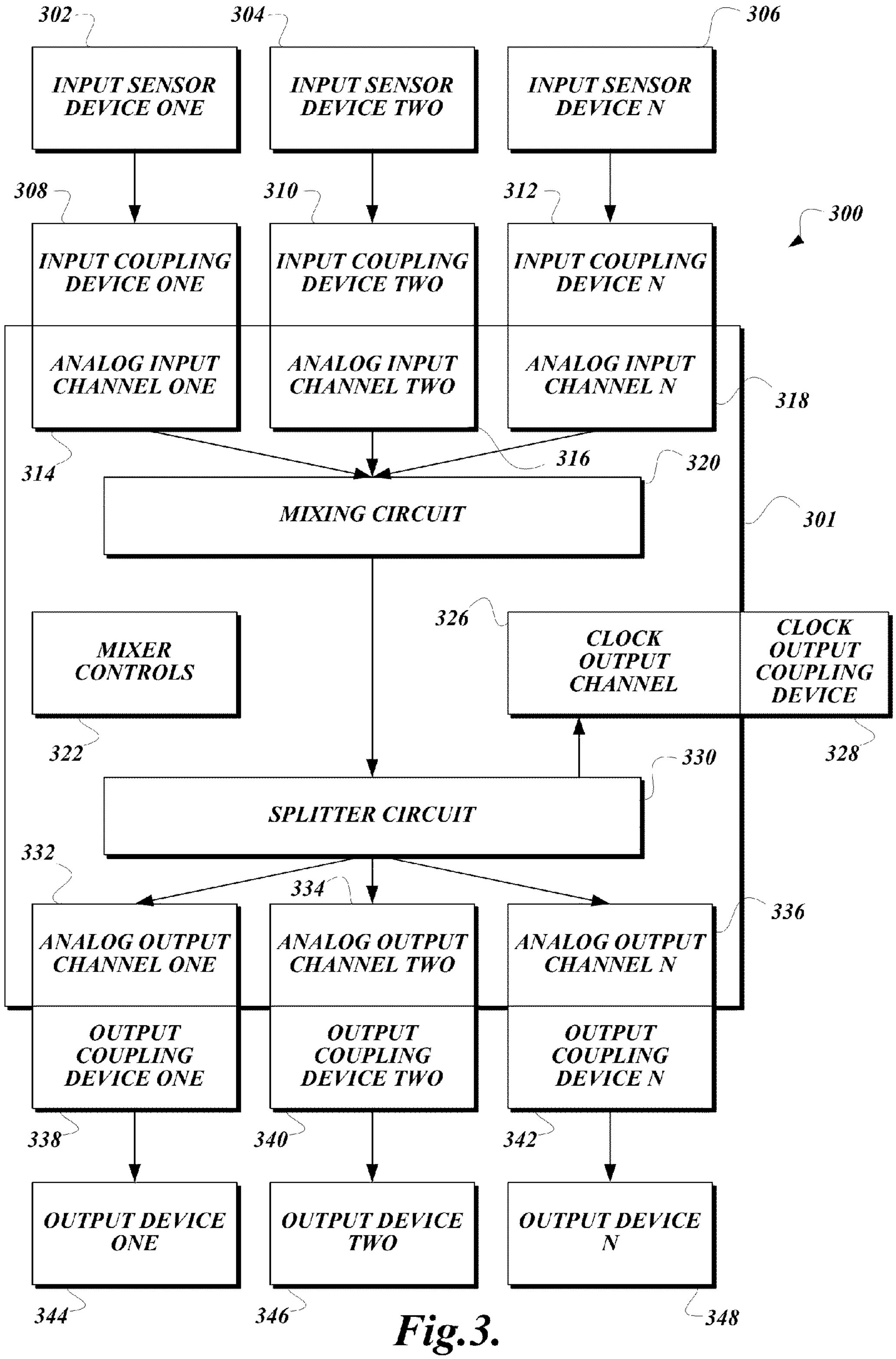
FIG. 3 is a block diagram that illustrates components included in an exemplary analog recursion system according to various aspects of the present disclosure.

FIG. 3 is a block diagram that illustrates components included in an exemplary analog recursion system 300 according to various aspects of the present disclosure. The analog recursion device 301 is similar to the analog recursion device 214 and the analog recursion device 102 illustrated and described above. The analog recursion device 301 includes a set of analog input channels 314, 316, 318. The set of analog input channels 314, 316, 318 are configured to receive input from a corresponding set of input sensors 302, 304, 306 via a corresponding set of input coupling devices 308, 310, 312. Though three analog input channels 314, 316, 318, input sensors 302, 304, and 306, and input coupling devices 308, 310, 312 are present in the illustrated embodiment, in other embodiments, more or fewer of any of these components may be present.

In some embodiments, the sensor devices are configured to sense a condition and to generate a signal based on the sensed condition. A wide variety of devices may be used as sensor devices. For example, a simple induction coil may be used as a sensor device. As a more complex example, a CCD image sensor may be used as a sensor device. In some embodiments, at least one of the sensor devices may be a complex device that includes a sensor as a subcomponent, such as a video camera and/or the like.

In some embodiments, the coupling devices are configured to provide the signal generated by the sensor devices to the analog recursion device 301. In some embodiments, a coupling device may simply provide a transmission path for the signal from a sensor device to the analog recursion device 301. As one nonlimiting example, a microphone cable may act as a coupling device that couples a microphone to the analog recursion device 301. As another nonlimiting example, a ¼ inch patch cable may act as a coupling device that couples an output of a guitar having an inductive coil sensor device to the analog recursion device 301. In some embodiments, a coupling device may perform further processing of the signal generated by a sensor device before providing a processed signal to the analog recursion device 301. For example, the guitar discussed above may be coupled to an effects unit. While acting as a coupling device, the effects unit may process the signal generated by the guitar before providing a processed signal to the analog recursion device 301. In some embodiments, multiple coupling devices may be used to couple a single sensor device to the analog recursion device 301. For example, a patch cable may be used to couple an output of a guitar to one or more chained effects units, and an additional patch cable may be used to couple an output of the effects units to the analog recursion device 301.

The signals received by the set of analog input channels 314, 316, 318 are provided to a mixing circuit 320. The mixing circuit 320 combines the signals from the set of analog input channels 314, 316, 318 based on settings of a set of mixer controls 322 to create a mixed input signal. The set of mixer controls 322 may affect the mixed input signal in various ways. For example, the set of mixer controls 322 may include level controls corresponding to each of the analog input channels 314, 316, 318 that change a contribution of the analog input channels 314, 316, 318 to the mixed input signal. As another example, the set of mixer controls 322 may include equalizer controls corresponding to each of the analog input channels 314, 316, 318 that change a balance of various frequency components provided to the mixed input signal for each analog input channel 314, 316, 318. In some embodiments, additional mixer controls 322 for each channel, such as pan controls, filter controls, and/or the like may be provided for each analog input channel 314, 316, 318, and in some embodiments, mixer controls 322 may be provided that affect each of the analog input channels 314, 316, 318 equally or affect the mixed input signal after the individual components from the analog input channels 314, 316, 318 have been combined.

Once combined, the mixing circuit 320 provides the mixed input signal to a splitter circuit 330. The splitter circuit 330 is configured to provide the mixed input signal to a set of analog output channels 332, 334, 336 as a mixed output signal. Similar to the set of analog input channels 314, 316, 318, the set of analog output channels 332, 334, 336 are configured to provide the mixed output signal to a corresponding set of output devices 344, 346, 348 via a corresponding set of output coupling devices 338, 340, 342. The set of output devices 344, 346, 348 and the set of input sensors 302, 304, 306 are configured such that the set of input sensors 302, 304, 306 sense the output of the set of output devices 344, 346, 348 in order to close a set of analog recursion loops.

In some embodiments, the mixing circuit 320 may generate more than one mixed output signal. As one nonlimiting example, the mixing circuit 320 may generate a monaural signal that combines multiple input signals into a single signal, as well as stereo signals that split at least some input signals into a left channel signal and a right channel signal. As another nonlimiting example, the mixing circuit 320 may generate separate signals in distinct frequency bands. As yet another nonlimiting example, the mixing circuit 320 may generate multiple mixed output signals based on different input signals. For instance, a first mixed output signal may be based only on a signal received from analog input channel one 314 and a signal received from analog input channel two 316, while a second mixed output signal may be based on signals received from all of the analog input channels 314, 316, 318.

In the illustrated embodiment, the splitter circuit 330 also provides a signal to a clock output channel 326. The clock output channel 326 is configured to provide the mixed output signal to a clock output coupling device 328. In some embodiments, the clock output coupling device 328 may rectify or clip the mixed output signal to generate a digital signal usable as a clock signal, as discussed above. In some embodiments, the clock output coupling device 328 may provide the analog mixed output signal to be used as a clock signal based on its frequency. Though the illustrated embodiment is configured such that the splitter circuit 330 provides a signal to the clock output channel 326, in other embodiments, the clock output channel 326 may receive a signal from a different portion of the analog recursion system 300. For example, in some embodiments, the clock output channel 326 may receive a signal based on a signal received by one or more of the analog input channels 314, 316, 318 before being combined with other signals by the mixing circuit 320. In some embodiments, the clock output coupling device 328 may combine multiple signals sampled from the analog recursion device 301 to generate clock output.

In some embodiments, the analog recursion device 301 may also include one or more amplifier circuits. The amplifier circuits may be coupled to an input or an output of any of the channels discussed above, and may either amplify an input signal to have a more significant effect within the analog recursion device 301, or may amplify an output signal to be more intensely reproduced by an output device.

Figure 4:
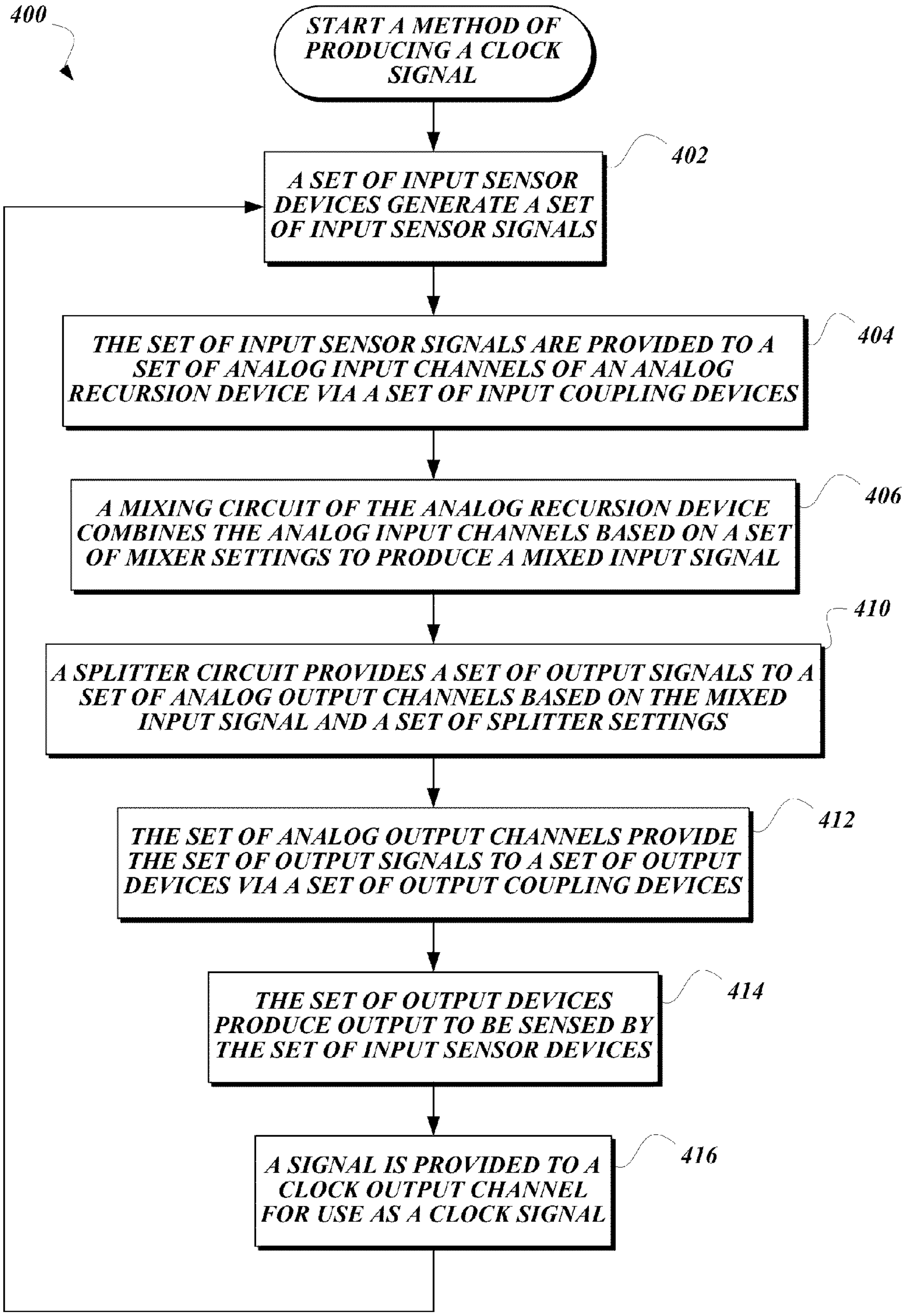
FIG. 4 illustrates an exemplary embodiment of a method of producing a clock signal according to various aspects of the present disclosure.

FIG. 4 illustrates an exemplary embodiment of a method 400 of producing a clock signal according to various aspects of the present disclosure. From a start block, the method 400 proceeds to block 402, where a set of input sensor devices generate a set of input sensor signals. At block 404, the set of input sensor signals are provided to a set of analog input channels of an analog recursion device via a set of input coupling devices. As discussed above, the input coupling devices may simply convey the input sensor signals to the analog input channels, or may perform processing on the input sensor signals before providing a processed signal to the analog input channels.

The method 400 proceeds to block 406, where a mixing circuit of the analog recursion device combines the analog input channels based on a set of mixer settings to produce a mixed input signal. In some embodiments, the set of mixer settings may be tuned in order to change one or more characteristics of a signal eventually provided to a clock output channel, such as its amplitude, frequency, and/or the like. At block 410, a splitter circuit provides a set of output signals to a set of analog output channels based on the amplified mixed input signal and a set of splitter settings. As discussed above, the set of output signals may include output signals based on different constituent signals, such as a monaural output signal, a left stereo output signal, a right stereo output signal, an output signal containing added effects, and/or the like. Next, at block 412, the set of analog output channels provide the set of analog output signals to a set of output devices via a set of output coupling devices. At block 414, the set of output devices produce output to be sensed by the set of input sensor devices. As discussed above, the output devices may be closely coupled to corresponding input sensor devices such that each recursion loop is isolated from the others, or at least one of the input sensor devices may be configured to sense output or other characteristics of more than one output device. In some embodiments, at least one recursion loop may not use an output device or an input sensor device, but may instead include an analog output channel coupled directly to an analog input channel.

At block 416, a signal is provided to a clock output channel for use as a clock signal. The signal provided to the clock output channel is based on at least one of the other signals propagating through the system, and may be based on or otherwise similar to one of the set of output signals or signals received by the analog input channels. As discussed above, in some embodiments, a device may be coupled to the clock output channel in order to convert the signal to a clock signal, while in other embodiments, an analog signal output by the clock output channel may itself be used as a clock signal. Though block 416 is illustrated after block 414, in some embodiments, the actions associated with block 416 may be performed at one or more times at any point during the method 400, continuously during the execution of the method 400, and/or at any other appropriate time.

As illustrated, the method 400 then returns to block 402 and repeats an arbitrary number of times. One of ordinary skill in the art will recognize that the method 400 may repeat for only a predetermined number of times, or may be terminated at any point.

Figure 5:
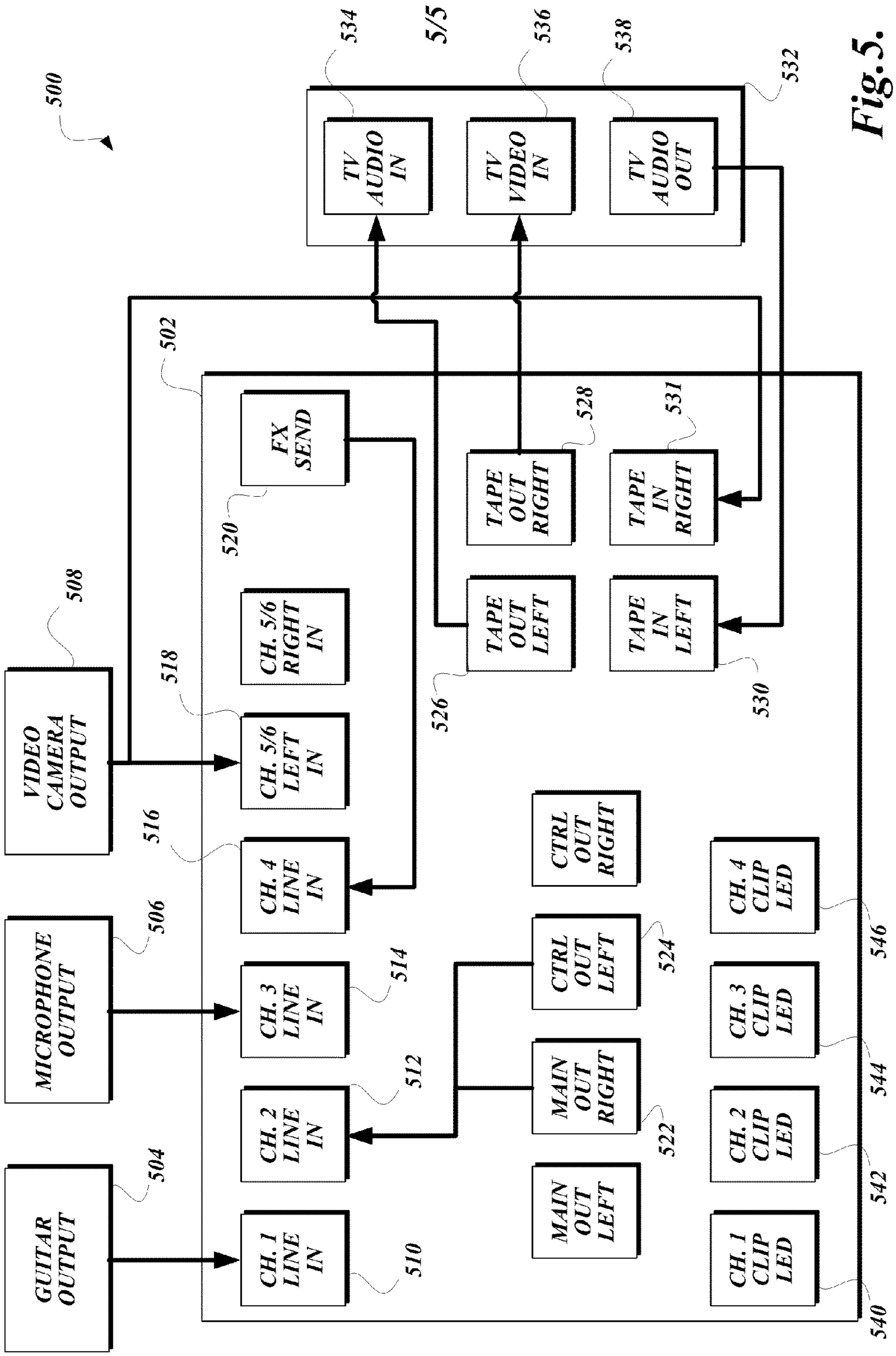
FIG. 5 illustrates aspects of an exemplary embodiment of an analog recursion system that embodies various aspects of the present disclosure.

While general concepts, techniques, and configurations used by embodiments of an analog recursion device are discussed and illustrated above, a description of an exemplary embodiment of an analog recursion device constructed from existing components may be instructive. FIG. 5 illustrates aspects of an exemplary embodiment of an analog recursion system that embodies various aspects of the present disclosure. One of ordinary skill in the art will understand that none of the particular components described are necessary, and be replaced with existing components of similar functionality, or may be replaced with custom-built or miniaturized components that provide similar functionality.

In FIG. 5, an analog audio mixer 502 serves as the analog recursion device discussed above. One example of a suitable analog audio mixer 502 is a Behringer® XENY 1202FX mixer, produced by Music Group IP Ltd., the operating manual for which is available from Music Group IP Ltd. and is incorporated by reference herein in its entirety. One of ordinary skill in the art will understand that other analog audio mixers with similar functionality and capabilities may be used instead. As illustrated, channels one through four of the analog audio mixer 502 are channels that may act as monaural channels or stereo channels depending on a type of signal supplied to the channel, while channels five and six are stereo channels. The other illustrated inputs and outputs will be familiar to one of ordinary skill in the art, and are described further in the operating manual incorporated by reference herein. One of ordinary skill in the art will recognize that the analog audio mixer 502 may have more or fewer inputs or outputs than those illustrated, and that certain inputs and outputs have been illustrated for clarity but are not numbered or described because they are not used by the illustrated embodiment.

Input is received by the analog audio mixer 502 from four external sources: a guitar output 504, a microphone output 506, a video camera output 508, and an audio output 538 of a television. An inductive coil in a pickup of the guitar serves as an input sensor device, while the remainder of the guitar electronics and patch cable serve as an input coupling device. One example of a suitable guitar for producing the guitar output 504 is an SG® guitar from Gibson Guitar Corp. Such a guitar includes a pair of humbucker pickups, which are configured to eliminate interference or hum. Other similar guitars or pickups may be used instead. The guitar may be situated such that the pickup reacts to oscillations observable in one or more components of a power supply of the analog audio mixer 502 (not illustrated). While an audio output of the analog audio mixer 502 is not coupled to the power supply, the oscillations of the power supply will nevertheless be affected by signals propagating recursively through the analog audio mixer 502. The microphone output 506 is provided by a Beta 58A® vocal microphone from Shure Incorporated. One of ordinary skill in the art will recognize that any similar microphone that may instead be used. A sensor of a video camera serves as another input sensor device. Any video camera having an analog composite video output (or individual component video outputs) that can be connected to an audio input of the analog audio mixer 502 may be used. One suitable camera is the Model Number IB5632MV, from Eyemax, though other similar cameras having composite video output may be used instead.

A television 532 may be used as both an output device and an input sensor device. In such a case, a suitable television 532 includes an analog audio input 534, an analog video input 536 (such as a composite video input and/or the like), and an analog audio output 538. One suitable television 532 is Model Number 24SL410U from Toshiba America, Inc., though other model televisions that include an analog audio input, an analog video input, and an analog audio output may also be suitable.

FIG. 5 illustrates how the described components may be connected to form an analog recursion system 500. The guitar output 504 is connected to channel one line in 510 of the analog audio mixer 502. The microphone output 506 is connected to the channel three line in 514 of the analog audio mixer 502. The video camera output 508 is connected to the channel five/six left input 518 and the tape in right input 531 of the analog audio mixer 502. The television audio output 538 is connected to the tape in left input 530 of the analog audio mixer 502.

The main out right output 522 and the control out left output 524 of the analog audio mixer 502 are combined by a Y-shaped cable, and are connected to the channel two line in 512 of the analog audio mixer 502. The FX send output 520 of the analog audio mixer 502 is connected to the channel four line in 516 of the analog audio mixer 502. The tape out left output 526 is connected to the television audio in 534 of the television 532, and the tape out right output 528 is connected to the television video in 536 of the television 532.

One of ordinary skill in the art will recognize that each of these connections may be made by traditional analog connection cables such as ¼ inch patch cables, RCA cables, microphone cables, and/or the like.

The analog audio mixer 502 may also include a CD/TAPE TO MIX switch, a CD/TAPE TO CTRL switch, and/or an FX TO CTRL switch (not illustrated). As known to one of ordinary skill in the art, these switches determine which of the channels are included in the illustrated tape out left output 526, the tape out right output 528, and the ctrl out left output 524 (as well as other outputs that are not discussed further). In one embodiment, the CD/TAPE TO MIX switch may be engaged, but in other embodiments, other combinations of switches may be engaged. In one embodiment, an on-board digital effects processor of the analog audio mixer 502 is set to a bypass effect or otherwise disabled. However, in other embodiments, the on-board digital effects processor may be used to help tune the analog recursion system 500.

Once the connections described above are made, the mixer settings may be used to determine input signals included in given output signals and to tune the analog recursion system 500 to a desired clock frequency. To help the analog recursion system 500 stabilize to a predetermined frequency, one or more tuning devices may be used. As an example, two BOSS TU-2 chromatic tuners may be coupled to the analog recursion system 500. The first tuner may be coupled in-line with the guitar output 504 and the channel one line in 510. The second tuner may be coupled in-line with the FX send output 520 and the channel four line in 516. The settings of the analog audio mixer 502 may be adjusted until each of the tuners stabilizes on a particular note of the chromatic scale, such as G# or any other tone in the chromatic scale with infinite semitone possibilities.

Stable periodic phenomena occur within the analog recursion system 500 that may be harnessed for a variety of purposes. For example, the stable periodic phenomena may be sampled to produce a clock signal. In the illustrated analog audio mixer 502, clip LEDs 540, 542, 544, 546 are provided for one or more channels. Periodic flashing of the clip LEDs 540, 542, 544, 546 may be sampled by a photodetector, or by a probe wired directly into the LED circuit, to produce a clock signal.

While analog signals are primarily discussed above for the sake of discussion and implementation, one of ordinary skill in the art will recognize that digital or other signals may be used without departing from the spirit and scope of the disclosure. For example, a digital recursion system constructed and operating similar to the analog recursion system discussed herein could also be used. Even in the discussed analog recursion system, a signal traditionally described as digital may be treated as an analog input or output signal and used as discussed herein. Further, an output signal traditionally considered an audio signal may be provided to an output device traditionally considered to accept video input of a predetermined format, even if the audio signal is not in the predetermined format.

While illustrative embodiments have been illustrated and described, it will be appreciated that various changes can be made therein without departing from the spirit and scope of the disclosure.

The embodiments of the invention in which an exclusive property or privilege is claimed are defined as follows:

1. A recursion loop system for generating a clock signal, the system comprising:
- a mixing device including:
  - a set of input channels configured to generate a set of input signals;
  - a mixing circuit configured to receive and combine the set of input signals from the set of input channels into a mixed harmonized input signal;
  - a splitter circuit configured to receive the mixed harmonized input signal and to provide a set of output signals;
  - a set of output channels configured to receive output signals from the splitter circuit and to generate output signals based on the input signals; and
  - a clock output channel configured to output a mixed harmonized periodic signal based on the mixed harmonized input signal, wherein the mixed harmonized periodic signal is usable as a clock signal;
- a set of output devices coupled to the set of output channels and configured to generate output based on the output signals; and
- a set of input devices coupled to the set of input channels and configured to generate input signals based on the output generated by the set of output devices, thereby forming a recursion loop.

2. The system of claim 1, wherein the set of output devices includes at least one of a loudspeaker and a display device.

3. The system of claim 1, wherein the set of input devices includes at least one of a microphone, an inductive coil, and a video camera.

4. The system of claim 1, wherein the mixing device further includes a set of mixer controls configured to alter a contribution of one or more of the input signals to the mixed input signal to change a characteristic of the periodic signal usable as a clock signal.

5. The system of claim 1, further comprising an input coupling device configured to process an output of an input device of the set of input devices and to provide a processed signal to an input channel of the set of input channels.

6. The system of claim 1, further comprising an output coupling device to convert an output signal of an output channel of the set of output channels to a signal acceptable by an output device of the set of output devices.

7. The system of claim 1, wherein the mixing device further includes an amplifier circuit configured to amplify the input signals.

8. A method performed by a recursion loop device of producing a clock signal, the method comprising:
- receiving a set of input signals;
- mixing the set of input signals into a mixed harmonized input signal;
- splitting the mixed harmonized input signal and producing a set of output signals based on the set of input signals;
- transmitting the set of output signals to affect the set of input signals; and
- sampling a state of the recursion loop device to generate a mixed harmonized periodic clock signal based on the mixed harmonized input signal.

9. The method of claim 8, wherein producing the set of output signals includes combining at least two signals of the set of input signals based on a set of mixer settings.

10. The method of claim 8, wherein producing the set of output signals includes:
- combining a first subset of the set of input signals to produce a first output signal; and
- combining a second subset of the set of input signals to produce a second output signal;
- wherein the first subset of the set of input signals and the second subset of the set of input signals are different.

11. The method of claim 8, wherein sampling a state of the recursion device to generate a clock signal includes:
- monitoring a state of an LED; and
- generating the clock signal based on the state of the LED.

12. An analog recursion device, comprising:
- a mixing circuit; and
- a set of recursion loops coupled to the mixing circuit;
- wherein the analog recursion device is configured to:
  - receive a set of signals via the set of recursion loops;
  - process the set of signals using the mixing circuit to produce a mixed harmonized input signal;
  - provide the processed set of signals to the set of recursion loops; and
  - provide a state to be sampled to generate a clock signal, wherein the clock signal is a mixed harmonized periodic signal based on the mixed harmonized input signal.

13. The analog recursion device of claim 12, wherein processing the set of signals includes combining at least two signals of the set of signals based on a set of mixer settings.

14. The analog recursion device of claim 12, wherein processing the set of signals using the mixing circuit includes:
- combining a first subset of the set of signals to produce a first processed signal; and
- combining a second subset of the set of signals to produce a second processed signal;
- wherein the first subset of the set of signals and the second subset of the set of signals are different.

15. The analog recursion device of claim 12, wherein providing a state to be sampled to generate a clock signal includes causing an LED to be activated periodically.

* * * * *

UNITED STATES PATENT AND TRADEMARK OFFICE

CERTIFICATE OF CORRECTION

PATENT NO. : 8,525,562 B1
APPLICATION NO. : 13/597034
DATED : September 3, 2013
INVENTOR(S) : John David Jones It is certified that error appears in the above-identified patent and that said Letters Patent is hereby corrected as shown below:

In the Specifications

On column 7, line 23, "XENY" to read as --XENYX--.

Signed and Sealed this
Twenty-eighth Day of January, 2014

Michelle K. Lee
*Deputy Director of the United States Patent and Trademark Office*